(12) United States Patent
Kay

(10) Patent No.: US 10,998,866 B2
(45) Date of Patent: May 4, 2021

(54) PREAMPLIFIER CIRCUIT CONFIGURATION

(71) Applicant: Kay Consulting, Inc., Dripping Springs, TX (US)

(72) Inventor: Jack Kay, Dripping Springs, TX (US)

(*) Notice: Subject to any disclaimer, the term of this patent is extended or adjusted under 35 U.S.C. 154(b) by 180 days.

(21) Appl. No.: 16/504,202

(22) Filed: Jul. 5, 2019

(65) Prior Publication Data
US 2020/0059205 A1 Feb. 20, 2020

Related U.S. Application Data

(60) Provisional application No. 62/720,109, filed on Aug. 20, 2018.

(51) Int. Cl.
| | |
|---|---|
| *H03F 3/181* | (2006.01) |
| *H03G 3/16* | (2006.01) |
| *H03G 9/22* | (2006.01) |
| *H03G 7/02* | (2006.01) |

(52) U.S. Cl.
CPC .............. *H03F 3/181* (2013.01); *H03G 3/16* (2013.01); *H03G 7/02* (2013.01); *H03G 9/22* (2013.01); *H03F 2200/03* (2013.01); *H03F 2200/111* (2013.01); *H03F 2200/267* (2013.01); *H03G 2201/103* (2013.01); *H03G 2201/702* (2013.01)

(58) Field of Classification Search
CPC .................................. H03F 3/181; H03G 3/16
See application file for complete search history.

(56) References Cited

U.S. PATENT DOCUMENTS

| | | | | |
|---|---|---|---|---|
| 5,012,199 | A * | 4/1991 | McKale ............... | G10H 1/0553 330/145 |
| 6,792,120 | B1* | 9/2004 | Szenics .................. | G10H 3/146 181/141 |
| 2010/0259328 | A1* | 10/2010 | Giovannotto ............. | H03F 3/26 330/195 |
| 2011/0013782 | A1* | 1/2011 | Moomey ................ | H04R 1/403 381/87 |
| 2016/0156321 | A1* | 6/2016 | Akino ....................... | H03F 5/00 381/113 |

* cited by examiner

*Primary Examiner* — Patricia T Nguyen
(74) *Attorney, Agent, or Firm* — Wei Wei Jeang; Grable Martin Fulton PLLC

(57) ABSTRACT

An audio preamplifier includes a first stage including a first triode of a first vacuum tube in a common cathode configuration configured to perform a first gain function favoring one of low frequencies and mid-range frequencies in response to user input; a second stage including a second triode of the first vacuum tube in a common cathode configuration configured to perform a second gain function favoring one of low frequencies and mid-range frequencies in response to user input; a third stage including a first triode of a second vacuum tube in a common cathode configuration configured to perform a tone-shaping function favoring one of low frequencies and mid-range frequencies in response to user input; and a fourth stage including a second triode of the second vacuum tube in a follower configuration configured to perform a tone stack function in response to user input.

21 Claims, 4 Drawing Sheets

PREAMPLIFIER CIRCUIT CONFIGURATION

RELATED APPLICATION

This application claims the benefit of U.S. Provisional Patent Application No. 62/720,109 filed on Aug. 20, 2018, which is incorporated herein in its entirety.

FIELD

The present disclosure relates generally to an audio signal preamplifier, and in particular to a novel preamplifier circuit configuration.

BACKGROUND

A musical instrument amplifier (or amp) is an electrical or electronic device or system that strengthens the weak electrical signal output from a pickup on an electric guitar, bass guitar, or other instruments that can be amplified so that it can drive the sound signals through one or more loudspeakers. An amplifier typically has a preamplifier stage and a power amplifier stage that may be housed separately as two independent units or together in one cabinet. Amplifiers not only magnify the sound of the instrument, but may also emphasize or de-emphasize certain frequencies and change the tonal characteristics of the sound. For some electric guitar players, their choice of guitar amplifier and the amplifier settings they use are a significant contribution to their signature sound.

DETAILED DESCRIPTION

Vacuum tubes were by far the dominant active electronic components in most instrument amplifier applications until the 1970's, when amplifier designs began to employ solid-state transistors. The use of solid-state transistors resulted in less expensive amplifiers, reduced the weight and heat output of the amplifier, and tended to be easier to maintain, more reliable, and shock-resistant. However, many musicians continue to use amplifiers built with vacuum tubes as they prefer the "warmer" sound quality output from these amplifiers over digital amplifiers.

In addition to differences between digital solid-state amplifiers and vacuum tube-based analog amplifiers, guitar amplifiers also are distinguished as the American amplifier configuration that tend to place more emphasis on the low-frequency range (e.g., lower than 250 Hz) with a little less gain resulting in more bass and not as much overdrive distortion, in contrast with the British amplifier configuration that tend to place more emphasis on the mid- and upper-range frequency range (e.g., 250 Hz-2000 Hz) with more gain resulting in more distortion. Some have characterized the British sound as "brighter" and more "sparkling."

Figure 1:
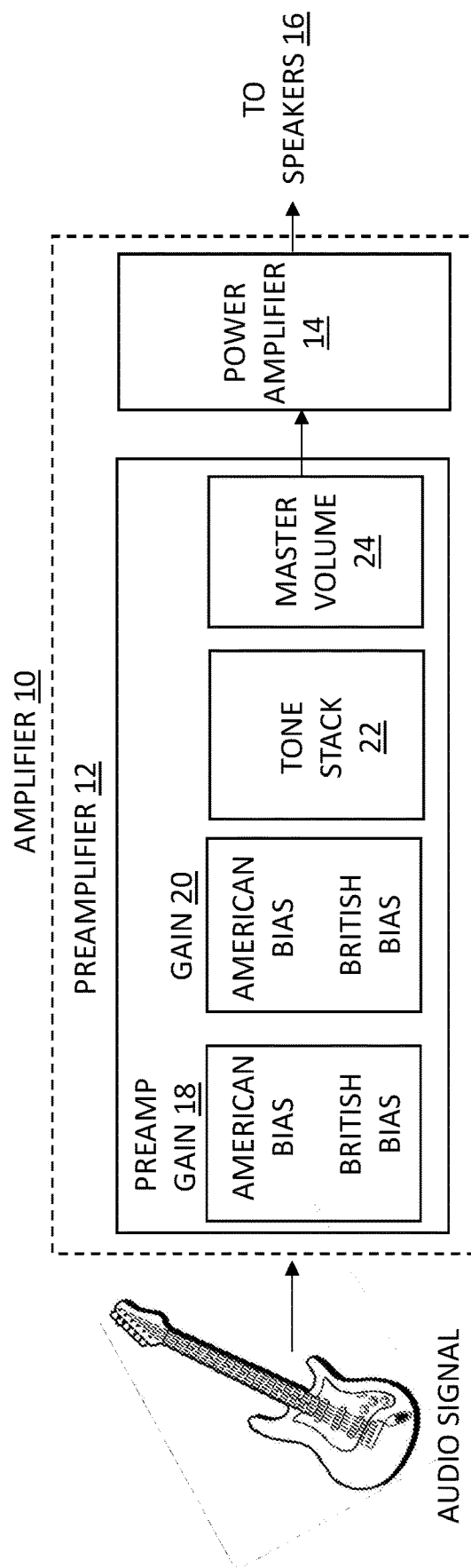
FIG. 1 is a simplified block diagram of an exemplary embodiment of a novel preamplifier circuit configuration according to the teachings of the present disclosure.

FIG. 1 is a simplified block diagram of an amplifier 10 that includes a preamplifier stage 12 and a power amplifier stage 14. The preamplifier 12 is used to boost an audio signal input and to shape the sound before it is provided to the power amplifier stage 14, which provides the gain to the signal to drive the speakers 16. The preamplifier stage 12 described herein is configured to be able to change the biasing and coupling circuit configuration of its vacuum tube stages (preamp gain 18 and gain 20) according to user input so that the output sound quality may lean more "American" or more "British," where the American tone places more emphasis on the low-frequency range and the British tone places more emphasis on the mid-frequency range. In other words, the British tone tends to have brighter and more sparkling mid-range frequency sounds compared to the American tone. Further, the preamplifier stage 12 may include a tone stack 22, which is a specialized type of audio filter that alters the frequency response (bass, mid-range, treble, and presence) of the preamplifier 12. The preamplifier 12 may further include a master volume section 24 that allows the user to control the preamp stage level independent of the power amplifier volume.

Figure 2:
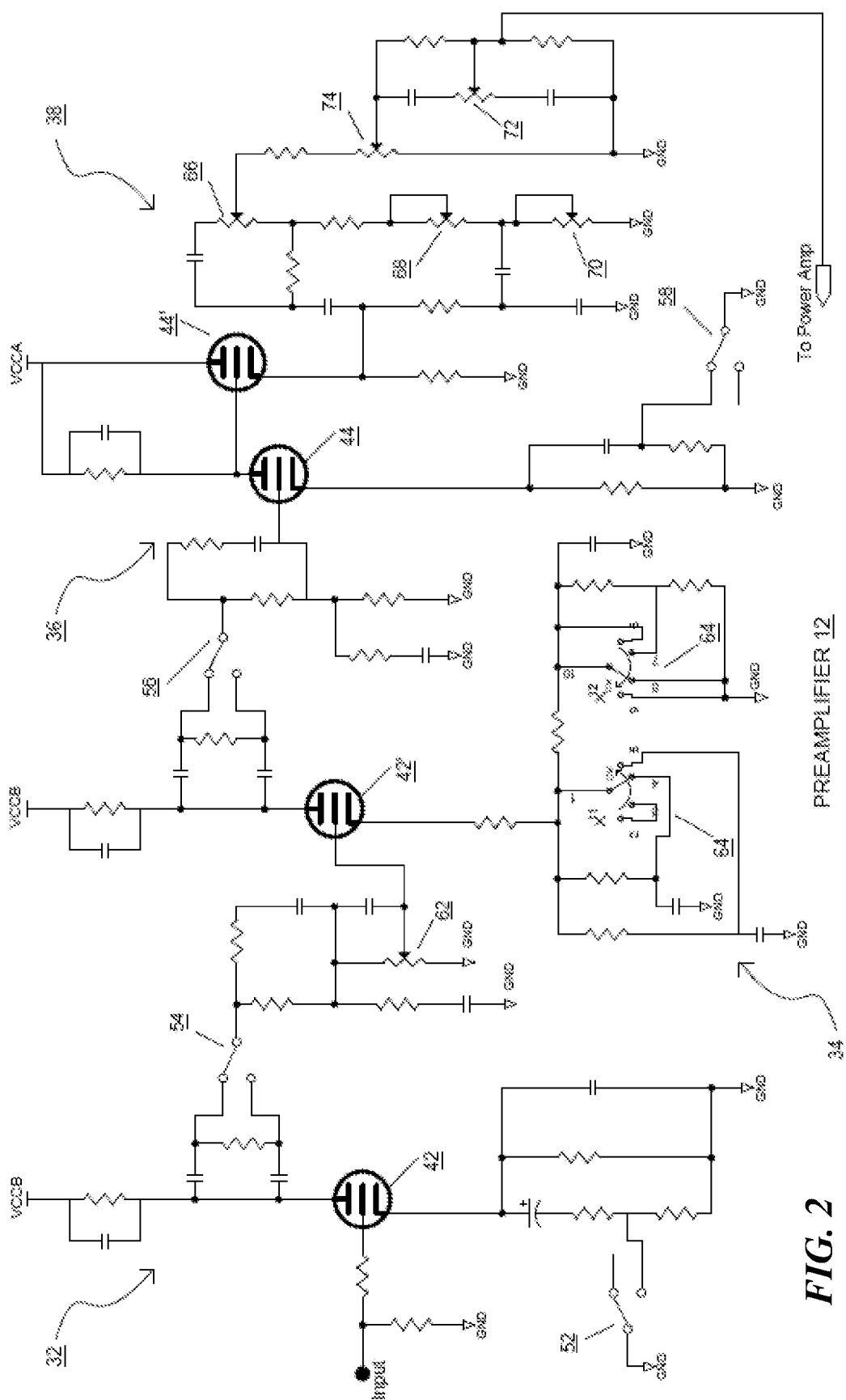
FIG. 2 is a detailed circuit schematic diagram of an exemplary embodiment of a novel preamplifier circuit configuration according to the teachings of the present disclosure.
Figure 3:
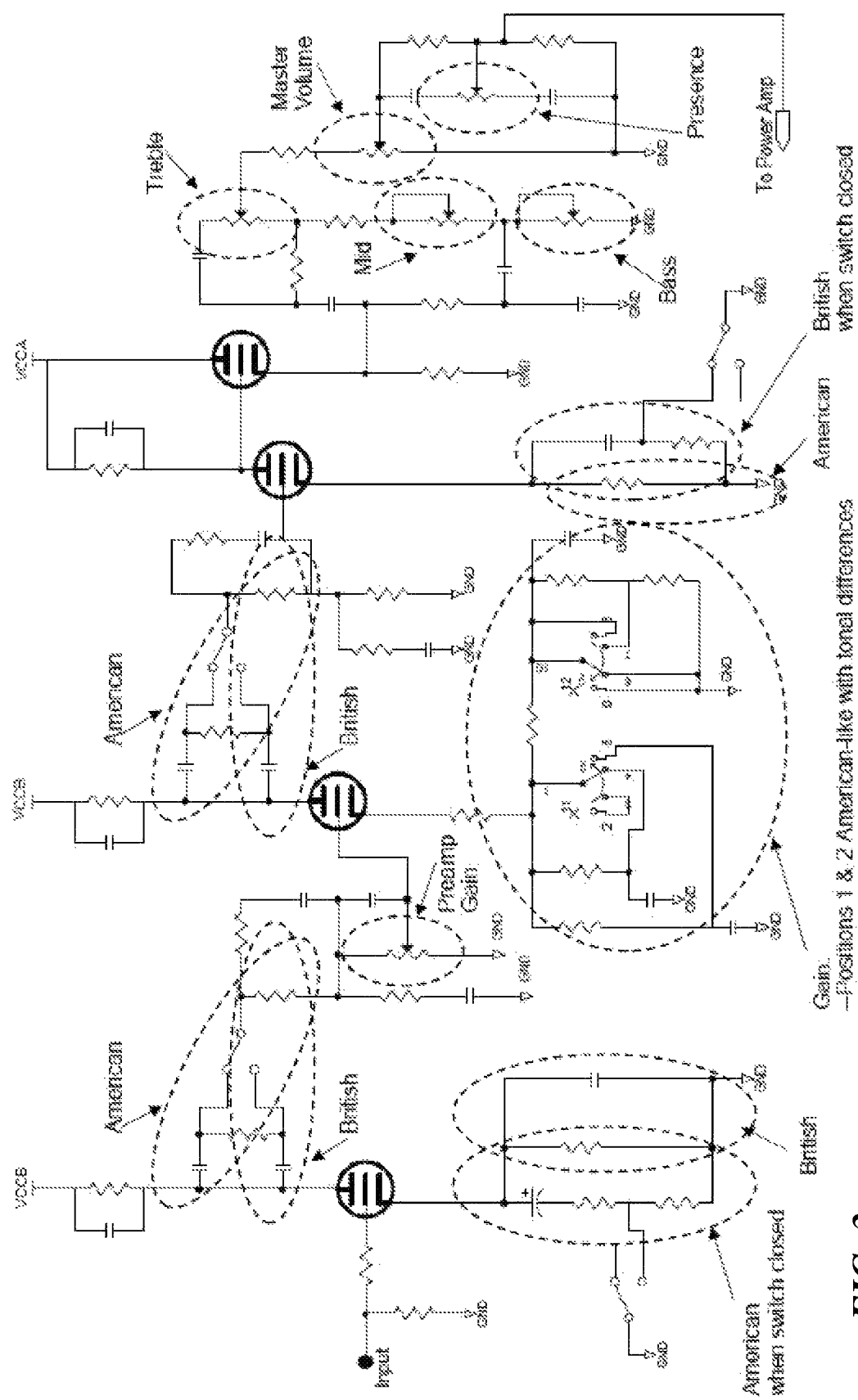
FIG. 3 is yet another detailed circuit schematic diagram of an exemplary embodiment of a novel preamplifier circuit configuration according to the teachings of the present disclosure.

FIG. 2 is a detailed circuit diagram of a preferred embodiment of a preamplifier 12 according to the teachings of the present disclosure. The preamplifier 12 includes four stages 32-38. Stages 32 and 34 include a dual-triode vacuum tube (shown as tubes 42 and 42'), and stages 36 and 38 include a dual-triode vacuum tube (shown as tubes 44 and 44'). The first three stages 32-36 are primarily gain and tone-shaping stages, where the vacuum tubes 42, 42' and 44 are in a common cathode configuration. Referring also to FIG. 3, each of the first three stages 32-36 shapes the tone according to the user's selection of "American" or "British" mode and in a different way that contributes to the overall "voice" of the preamplifier 12.

According to convention, each vacuum tube 42, 42' and 44 in the common cathode configuration is connected with a grid section, an anode section, a cathode section, and an attenuator section. In the triode configuration of the tube, if the control grid voltage is positive relative to the cathode, then current flow is enhanced. Similarly, if the control grid voltage excursion is negative relative to the cathode, then the current flow is impeded. Lastly, if the control grid voltage is sufficiently negative relative to the cathode, then all of the current will be impeded with the exception of residual leakage. Controlling (or modulating) the current flow in the device by varying the control grid voltage is the mechanism through which gain is achieved. The grid resistors set the bias of the control grid and can be used with other components to impact frequency response of the amplifier. The capacitance values and resistor values in the grid, anode, cathode, and attenuator sections can be selected for the circuit configuration based on a user's desired sound output.

In the common cathode amplifier configuration, the cathode of the vacuum tube 42 is coupled to ground through a bypass capacitor that is coupled in parallel with a cathode resistor used to develop the cathode bias voltage. The cathode resistor controls the headroom of the stage (output before clipping) and linearity, or distortion level, of the stage. As the bias point is shifted, the amplifier will clip more on the top or bottom portion of the waveform. Bypassing the cathode resistor can impact the gain over certain frequency ranges, which can affect the tonal characteristics of that stage. In the first stage 32 of the preamplifier 12, the switch 52 selects the cathode capacitor and cathode resistor values that results in the "American" or "British" tonal differences. Switch 54 selects the inter-stage coupling capacitance values of tube 42 that also results in "American" or "British" tonal differences. Switch 56 in stage 34 at the output of tube 42' selects the output capacitance values of tube 42' that also results in American or British tonal differences. In the common cathode configuration, the inter-stage coupling capacitor is used to isolate the plate DC voltage from the next stage it is driving. The inter-stage coupling capacitor value, in conjunction with the input resistance of the following stage 34, also controls the frequency response of the stage. Switch 58 in stage 36 coupled to the cathode of tube 44 also enables the user to select cathode bypassing, resulting a more "American" or "British" sound.

The fourth stage 38 includes a last vacuum tube 44' connected in a follower configuration and serves to isolate the standard tone-control section or the tone stack (treble, bass, mid, presence, and master volume) in the last stage 38 from the prior gain and tone-shaping stages 32-36. The fourth stage 38 includes a stack of three potentiometers that provide treble 66, mid-range 68, and bass 70 controls that enable user control of the amount of frequency bands removed from the audio signal.

The fourth stage 38 further includes a presence control 72 that boosts upper-mid-range and treble frequencies in a pre-specific manner that makes the tone sound "livelier" and "wilder," and thus bringing more of a "presence." In some amplifier systems, the presence control is more typically part of the power amplifier section. Lastly, the standard tonal control in the fourth stage 38 includes a master volume control 74 to give the user the option to control the signal level in the preamplifier 12 independent of the power amplifier output level.

The user may selectively configure each stage 32-36 of the preamplifier 12 by changing the vacuum tube bias to overdrive and distort an audio input signal and/or shape the tone. As described in more detail below, the user may switch one or more of the tube stages 32-36 between an American biasing and/or coupling configuration and a British biasing and/or coupling configuration to give the output of the preamplifier 12 a more American or British sound.

The vacuum tubes 42-48 may be implemented with miniature dual-triode vacuum tubes. The tubes 42-44' may include, for example, 12AX7 tubes with a high gain and a low plate current best suited for low-level voltage amplification. The 12AX7 was developed around 1946 by RCA.

Figure 4:
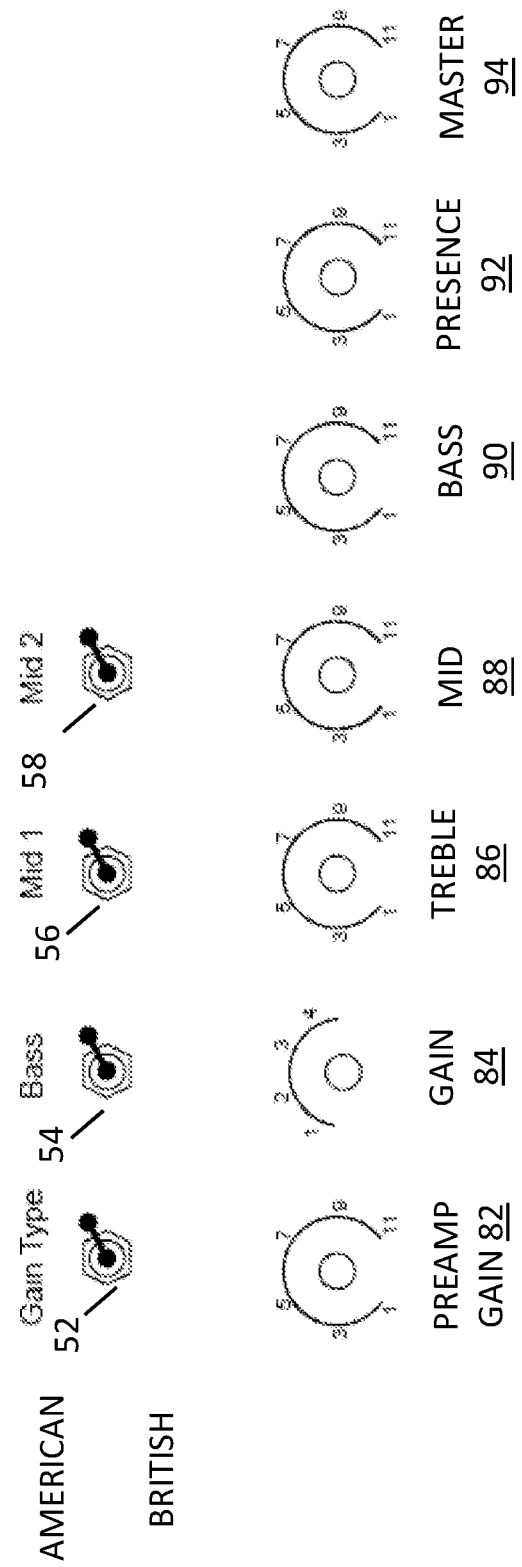
FIG. 4 is an illustration of an exemplary embodiment of user interface controls for a novel preamplifier circuit configuration according to the teachings of the present disclosure.

Referring also to the detailed circuit diagram with circuit portions labeled in FIG. 3, and a preferred embodiment of the user control interface in FIG. 4, the biasing circuit configuration of tubes 42, 42', and 44 in the first through third preamp stages 32-36 include single pole double throw switches 52-58 that enable the preamp output to sound more "American" or more "British." The second stage includes a four-position switch configured to receive user selection of one of four gain settings affecting overdrive levels allowing a selection of more American or British sounds. In the second stage 34, the position of the 2-pole 4-throw rotary switch (or 4-position rotary switch) 64 at 1 and 2 positions would produce more American-like sound with gain differences, and the position of the 4-position rotary switch 64 at 3 and 4 produces more British-like sound with gain and tonal differences. In all four stages, a plurality of multi-position knobs 82-94 (FIG. 4) allow a user to attenuate the resistance of variable resistors (or potentiometers) 62-74 to change the preamp gain (62), gain (64), treble (66), mid (68), bass (70), presence (72), and master volume (74) of the preamplifier 12.

The plurality of capacitors in the preamplifier stages may be configured to act as low-pass, mid-range frequency, and/or a treble (or high) frequency filters. Bleeder resistors are also provided to soften transition of load switching between the low-frequency biasing configuration, mid-range frequency biasing configuration, and the treble frequency biasing configuration. The bleeder resistor routes transient currents to circuit ground during load switching to prevent a large pop that may occur at the power amplifier output. In some embodiments, a resistive separation is provided between the controls of the treble frequency and the low-frequency and mid-range frequencies.

Although the description herein focuses on a preamplifier for electric guitars, the preamplifier circuit configuration described herein is applicable to a preamplifier for any audio signal. Circuit component values can be modified to change the frequencies affected by the switches and controls to be more optimal for various instruments (signal sources). More generally, the basic concept of this invention is to allow modification of preamplifier stages by switching between circuit characteristics and topologies of different "known" preamplifier types. To that end, there are various other locations in a preamplifier where similar "preamplifier type switching" can be employed. Additionally, a preamplifier can have more or fewer stages utilizing this same "preamplifier type switching" concept. Further, although the preamplifier circuit is described herein as a separate unit from the power amplifier, both the preamplifier and power amplifier may be a combined circuit and/or housed inside a single cabinet.

The features of the present invention which are believed to be novel are set forth below with particularity in the appended claims. However, modifications, variations, and changes to the exemplary embodiments of the novel preamplifier circuit configuration described above will be apparent to those skilled in the art, and the described herein thus encompasses such modifications, variations, and changes and are not limited to the specific embodiments described herein.

What is claimed is:

1. An audio preamplifier for processing an audio input signal comprising:
   a first stage configured for receiving the audio input signal including a first triode of a first vacuum tube in a common cathode configuration configured to perform a first gain function favoring one of low frequencies and mid-range frequencies in response to user input;
   a second stage coupled to the first stage including a second triode of the first vacuum tube in a common cathode configuration configured to perform a second gain function favoring one of low frequencies and mid-range frequencies in response to user input;
   a third stage coupled to the second stage including a first triode of a second vacuum tube in a common cathode configuration configured to perform a tone-shaping function favoring one of low frequencies and mid-range frequencies in response to user input; and
   a fourth stage coupled to the third stage including a second triode of the second vacuum tube in a follower configuration configured to perform a tone stack function in response to user input.

2. The audio preamplifier of claim 1, further comprising:
at least one two-position switch configured to receive user selection of one of low frequencies and mid-range frequencies; and
a four-position switch configured to receive user selection of one of four gain settings affecting overdrive levels.

3. The audio preamplifier of claim 1, wherein the first stage comprises a first biasing circuit coupled to the first triode of the first vacuum tube configured to emphasize low frequencies and a second biasing circuit coupled to the first triode of the first vacuum tube configured to emphasize mid-range frequencies.

4. The audio preamplifier of claim 3, wherein the third stage comprises a second biasing circuit coupled to the first triode of the second vacuum tube configured to emphasize low frequencies and a second biasing circuit coupled to the first triode of the second vacuum tube configured to emphasize mid-range frequencies.

5. The audio preamplifier of claim 1, wherein the fourth stage includes treble, mid-range, and bass tonal controls in response to user input.

6. The audio preamplifier of claim 1, wherein the fourth stage includes three potentiometers coupled in series and configured to provide treble, mid-range, and bass tonal controls in response to user input.

7. The audio preamplifier of claim 1, wherein the fourth stage includes a variable resistor configured to provide a presence control.

8. The audio preamplifier of claim 1, wherein the fourth stage includes a variable resistor configured to provide a master volume control.

9. An audio preamplifier for processing an audio input signal comprising:
a first triode in a common cathode configuration configured to perform a first gain function accentuating one of low frequencies and mid-range frequencies in response to user input;
a first biasing circuit coupled to the first triode configured to emphasize low frequencies and a second biasing circuit coupled to the first triode configured to emphasize mid-range frequencies;
at least one second triode in a common cathode configuration configured to perform at least one second gain function accentuating one of low frequencies and mid-range frequencies in response to user input;
at least one second biasing and coupling circuit coupled to the at least one second triode configured to emphasize low frequencies and at least one second biasing circuit coupled to the at least one second triode configured to emphasize mid-range frequencies; and
a third triode coupled to the at least one second biasing circuits configured to perform a tone stack function in response to user input.

10. The audio preamplifier of claim 9, further comprising:
at least one two-position switch configured to receive user selection of one of low frequencies and mid-range frequencies; and
a four-position switch configured to receive user selection of one of four gain settings affecting overdrive levels.

11. The audio preamplifier of claim 9, further comprising a coupling circuit comprising:
at least one two-position switch coupled between the first triode and the at least one second triode configured to receive user selection of one of low frequencies and mid-range frequencies.

12. The audio preamplifier of claim 9, wherein the at least one second biasing circuit comprises at least one multi-position switch configured to receive user selection of one of low frequencies and mid-range frequencies.

13. The audio preamplifier of claim 9, wherein the fourth stage includes treble, mid-range, and bass tonal controls in response to user input.

14. The audio preamplifier of claim 9, wherein the fourth stage includes three potentiometers coupled in series and configured to provide treble, mid-range, and bass tonal controls in response to user input.

15. The audio preamplifier of claim 9, wherein the fourth stage includes a variable resistor configured to provide a presence control.

16. The audio preamplifier of claim 9, wherein the fourth stage includes a variable resistor configured to provide a master volume control.

17. The audio preamplifier of claim 9, further comprising:
a two-position switch configured to receive user selection of one of low frequencies and mid-range frequencies coupled to a first stage to select a more American or British sound, respectively;
a multi-position switch coupled to a second stage configured to receive user selection of one of four gain settings affecting overdrive levels allowing a selection of a more American or British sound; and
a two-position switch configured to receive user selection of one of low frequencies and mid-range frequencies coupled to a third stage to select a more American or British sound, respectively.

18. An audio preamplifier for processing an audio input signal comprising:
a first stage including a first triode in a common cathode configuration configured to perform a first gain function favoring one of low frequencies and mid-range frequencies in response to user input;
a first biasing circuit coupled to the first triode configured to emphasize low frequencies and a second biasing circuit coupled to the first triode configured to emphasize mid-range frequencies;
a second stage including a second triode in a common cathode configuration configured to perform a second gain function favoring one of low frequencies and mid-range frequencies in response to user input; and
a second biasing circuit coupled to the second triode configured to emphasize low frequencies and a second biasing circuit coupled to the second triode configured to emphasize mid-range frequencies.

19. The audio preamplifier of claim 18, further comprising a third stage coupled to the second stage and including a third triode in a common cathode configuration configured to perform a third gain function favoring one of low frequencies and mid-range frequencies in response to user input.

20. The audio preamplifier of claim 18, further comprising an additional stage coupled to a preceding stage and including an additional triode in one of a common cathode configuration configured to perform a gain function and a follower configuration configured to perform a tone stack function in response to user input.

21. The audio preamplifier of claim 20, wherein the additional stage further comprises:
three potentiometers coupled in series and configured to provide treble, mid-range, and bass tonal controls in response to user input;
a variable resistor configured to provide a presence control; and a variable resistor configured to provide a master volume control.

* * * * *